United States Patent
Dunsmore et al.

(10) Patent No.: US 9,678,123 B2
(45) Date of Patent: Jun. 13, 2017

(54) SYSTEM AND METHOD FOR IMAGE SIGNAL REJECTION

(71) Applicant: Keysight Technologies, Inc., Minneapolis, MN (US)

(72) Inventors: Joel P. Dunsmore, Sebastopol, CA (US); Jean-Pierre Teyssier, Santa Rosa, CA (US); Jad Faraj, Santa Rosa, CA (US); James B. Kerr, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/710,476

(22) Filed: May 12, 2015

(65) Prior Publication Data

US 2016/0337887 A1   Nov. 17, 2016

(51) Int. Cl.
*H04W 24/08* (2009.01)
*G01R 23/16* (2006.01)

(52) U.S. Cl.
CPC .................................... *G01R 23/16* (2013.01)

(58) Field of Classification Search
USPC ........... 455/67.11, 115.1–115.4, 226.1–226.4
See application file for complete search history.

(56) References Cited

U.S. PATENT DOCUMENTS

| 5,465,414 A * | 11/1995 | Moskaluk | H03B 21/00 324/76.27 |
|---|---|---|---|
| 6,028,543 A * | 2/2000 | Gedcke | H03M 1/0604 341/118 |
| 6,636,816 B1 * | 10/2003 | Dvorak | G01R 27/28 324/76.41 |
| 6,861,833 B2 | 3/2005 | Miyauchi | |
| 8,203,472 B2 * | 6/2012 | Robinson | H03M 1/0836 341/118 |
| 2009/0239489 A1 * | 9/2009 | Kaczman | H04B 1/16 455/226.1 |
| 2010/0274561 A1 * | 10/2010 | Ahgren | G10L 21/0208 704/226 |

(Continued)

OTHER PUBLICATIONS

Agilent Technologies, Inc., "Spectrum Analysis Basics", Application Note 150, URL: http://cp.literature.agilent.com/litweb/pdf/5952-0292.pdf.

*Primary Examiner* — Ralph H Justus

(57) ABSTRACT

A radio frequency (RF) measurement system acting as a spectrum analyzer and a method of operating the same eliminates image signals from a detected input RF spectrum. The method includes determining at least three local oscillator (LO) frequencies; determining LO offsets between the LO frequencies; and mixing the LO frequencies with the input RF spectrum to provide corresponding intermediate frequency (IF) signals having an IF bandwidth, where at least one of the IF signals has the input RF spectrum mixed to a different portion of the IF bandwidth than at least one other of the IF signals, providing overlapping coverage. The method further includes acquiring ADC time records for the IF signals; performing Fourier transforms (FTs) on the ADC time records to provide IF spectrums; and detecting RF responses from the IF spectrums to determine an RF response trace corresponding to the input RF spectrum.

17 Claims, 11 Drawing Sheets

(56) References Cited

U.S. PATENT DOCUMENTS

2011/0202316 A1* 8/2011 Crooks ................ G01R 19/02
702/198
2014/0240605 A1* 8/2014 Basawapatna ....... G01R 23/165
348/725

* cited by examiner

SYSTEM AND METHOD FOR IMAGE SIGNAL REJECTION

BACKGROUND

Generally, conventional spectrum analyzers incorporate an architecture that converts a radio frequency (RF) input signal to an intermediate frequency (IF) signal for detection, through a mixing process. Direct RF detection is possible, for example, using a wideband analog-to-digital converter (ADC). However, wideband ADCs have limited dynamic range, tend to have high noise floors, and are relatively expensive.

A common mixing process incorporates a frequency converter, including a local-oscillator (LO) that generates an LO signal and a mixer that mixes the generated LO signal with the RF input signal to convert the RF frequency to a smaller intermediate frequency (IF), at which detection via a conventional ADC can be performed with less noise and at lower cost. The LO is tuned to generate an LO signal having an LO frequency that is higher or lower than the RF frequency of the RF input signal by the value of the IF. When the LO is tuned to an LO frequency higher than the RF frequency, and the intended RF detection band is lower by the IF, signals present at the input of the mixer an IF spacing above the LO frequency will also convert to the IF range and be detected. Such a signal may be referred to as an "image signal," which is not a "real signal" (or "actual signal"), but rather a signal that does not exist. The presence of an image signal is particularly problematic when trying to detect a signal having a relatively small amplitude at the RF frequency, while a large amplitude signal is present at the frequency of the image signal.

Historically, spectrum analyzers had no practical way of preventing such image signals, and therefore incorporated a method called "signal-ID," according to which the LO from the above the RF signal was switched to below the RF signal. In this manner, when the detected signal was at the RF frequency, the IF signal would not change. However, when the detected signal was an image signal, the detected signal would shift from the IF frequency to three-times the IF frequency, enabling identification of the detected signal as an image signal.

More recent conventional spectrum analyzers incorporate more complex procedures, using additional circuitry to create substantially image-free down-converters. This may be accomplished by up-converting the RF band, and then filtering the RF plus LO. The up-conversation causes the image signals to be separated far from the RF signals, and the filtering removes the image signals. The filtered, image-free first-converted signal is then down-converted to an IF to be detected. Because of the filtering, there are no unwanted signals present at the input of the second converter to cause image signals. However, this up-conversion technique is difficult and costly for higher frequency spectrum analyzers (e.g., 1 GHz and above).

Therefore, another technique was developed using a swept-tuned pre-selector, such as a YIG-tuned filter, to pre-filter the input RF signal to remove image signals before they arrive at the first converter. Current technology generally limits such pre-selectors to frequencies above about 2 GHz, or even above about 3.6 GHz. Notably, the pre-selector has the added advantage of removing large out-of-band signals that can otherwise cause compression of the input converter. However, the pre-selection technique is expensive, and cannot be used for multi-function instruments (such as PNA-X network analyzers, available from Keysight Technologies, Inc., which includes vector network analysis (VNA) as well as spectrum analysis capabilities) because the filtering, particularly tunable YIG-tuned filters, are not stable or repeatable enough to support stable phase and amplitude response through the filter. Further, the filtering to remove image signals is not exact, so some residual image signals may still be present in the response.

In addition, non-preselected versions of spectrum analyzers have been introduced, which use digital processing to remove image signals. For example, one such non-preselection spectrum analyzer uses a single-conversion mixer, but takes two data acquisitions. One data acquisition is taken with the LO frequency lower than the RF frequency of the input signal, and the other is taken with the LO frequency higher than the RF frequency. The spectrum analyzer processes the two signals, and thereby chooses the minimum of the two signals for display. When a real signal is present, it appears in both data acquisitions, and thus the proper level is displayed. When the signal is an image signal, it is large in one data acquisition and does not appear in the other data acquisition. Thus, the minimum of the two data acquisitions would be essentially the noise floor. The dual data acquisition technique is workable, except when the RF input signal comprises a two-tone or multi-tone signal that exactly matches two-times the IF. In this case, the image of one of the multiple tones will appear in the IF, resulting in erroneous detection. The spectrum analyzer may use a random LO for each acquisition to make this outcome less likely in a two tone case. However, when an unknown multi-tone signal is being measured, the random LO process practically ensures that occasionally the multi-tone signal will land on exactly the offset of the random LO and show a spurious signal. If randomization of the LO is turned off, there is no guarantee that the multi-tone signal will not land exactly on the LO offset and show a continuous image signal.

Thus, what is needed is improved discrimination of image signals, particularly with respect to multi-tone signals (having more than two-tones).

BRIEF DESCRIPTION OF THE DRAWINGS

The representative embodiments are best understood from the following detailed description when read with the accompanying drawing figures. Wherever applicable and practical, like reference numerals refer to like elements.

DETAILED DESCRIPTION

Figure 1:
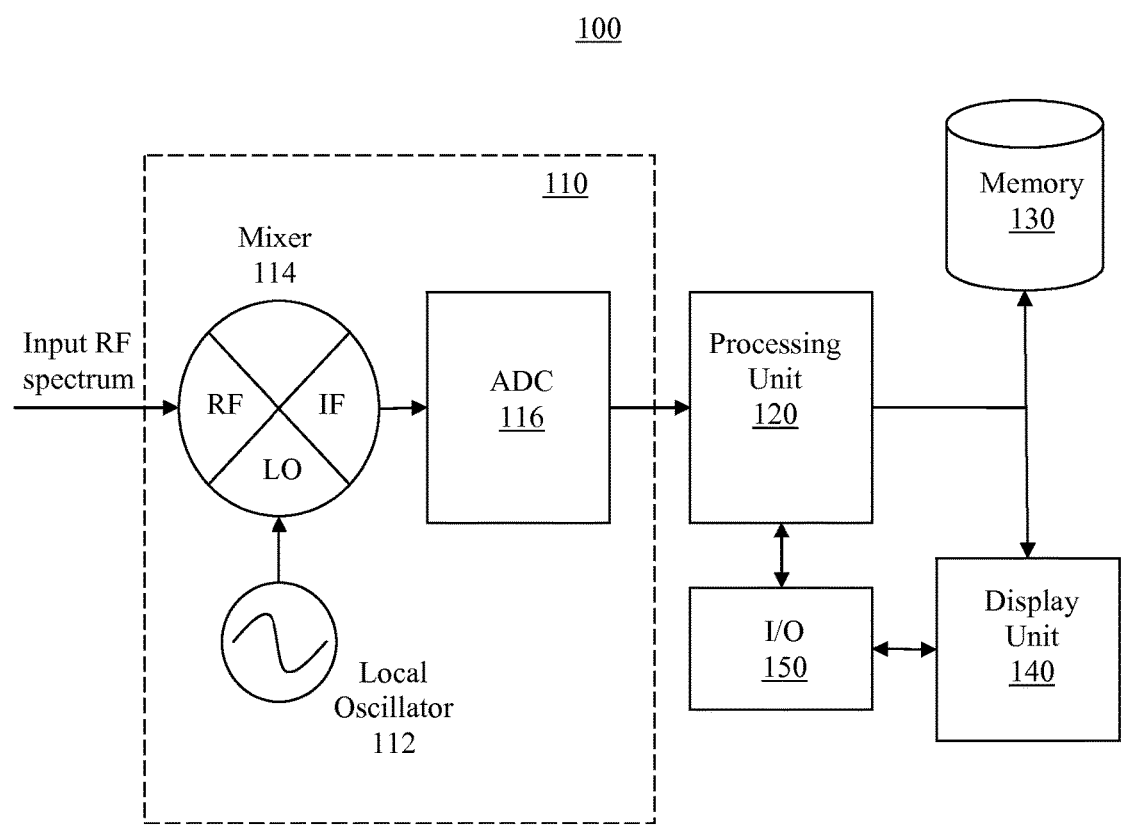
FIG. 1 is a simplified block diagram of a spectrum analyzer system configured to provide image rejection on a frequency (RF) spectrum, according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable.

As used in the specification and the appended claims and in addition to its ordinary meaning, the term "approximately" or "about" means to within an acceptable limit or amount to one having ordinary skill in the art. For example, "approximately the same" means that one of ordinary skill in the art would consider the items being compared to be the same.

Generally, according to various embodiments, an improved image rejection capability is provided for a spectrum analyzer and/or a radio frequency (RF) measurement system acting as a spectrum analyzer. Further, the image rejection capability may be extended to traditional spectrum analyzer architectures to remove low-level local oscillator (LO) spurious responses that now limit the ability of conventional spectrum analyzers to measure very low spurious signals without false detection. The various embodiments properly distinguish between real signals and image signals, enabling image rejection, even when multiple images overlap in intermediate frequency (IF) response regions.

According to various embodiments, a mixer receives an input radio frequency (RF) spectrum having multiple tones (e.g., more than two tones) having an RF span. The mixer mixes the input RF spectrum with multiple local oscillator (LO) frequencies that may be separated by non-uniform LO offset, and that enable overlapping IF bandwidths within the RF span. The non-uniform LO offset may be implemented randomly. The various embodiments effectively eliminate the possibility of an image signal landing on (i.e., having the same frequency as) each of the LO frequencies, and thereby avoiding detection (and suppression).

Thus, various embodiments provide an RF measurement system acting as a spectrum analyzer and a method of operating the same for eliminating image signals from a detected input RF spectrum. For example, the method includes determining at least three LO frequencies required for receiving the input RF spectrum; determining LO offsets between the at least three LO frequencies; and mixing the at least three LO frequencies with the input RF spectrum to provide at least three corresponding IF signals having an IF bandwidth, where at least one of the IF signals has the input RF spectrum mixed to a different portion of the IF bandwidth than at least one other of the IF signals, thereby providing overlapping coverage of the input RF spectrum; acquiring ADC time records for the IF signals. The method further includes performing Fourier transforms (FTs) on the ADC time records to provide IF spectrums, each IF spectrum including multiple FT bins representing corresponding multiple RF frequency bins representing the input RF spectrum; and detecting RF responses from the IF spectrums to determine an RF response trace corresponding to the input RF spectrum. The LO offsets may be non-uniform, and the non-uniform LO offsets may be randomly set.

FIG. 1 is a simplified block diagram of an RF measurement system acting as a spectrum analyzer configured to provide image rejection on an input RF spectrum, which may include a multi-tone input RF spectrum, according to a representative embodiment.

Referring to FIG. 1, RF measurement system 100, which may be a spectrum analyzer or acting as a spectrum analyzer, for example, includes a receiver 110 configured to receive and measure an input RF spectrum, which has one or more discrete frequency signals, referred to as tones. Notably, the RF measurement system 100 is able to reliably process multiple (e.g., two or more) tones, while rejecting image signals. The tones of a multi-tone input RF spectrum may come in tone pairs, and more than two tones may be at evenly spaced frequencies across the input RF spectrum. The receiver 110 includes a local oscillator (LO) 112 configured to generate different LO signals having different LO frequencies, and a mixer 114 configured to mix the input RF spectrum and the different LO signals to provide corresponding intermediate frequency signals, as discussed below. Accordingly, the mixer 114 includes an LO input, an RF input and an IF output. The receiver 110 further includes an analog-to-digital converter (ADC) 116, which has one or more channels, indicated by representative channel CHO, for receiving the IF signal from the IF output of the mixer 114. The ADC 116 converts the analog IF signals into digital data sets, which correspond to Fourier transform (FT) or frequency bins, discussed below. The ADC 116 may include a trigger-in port for triggering sampling operations.

In various embodiments, the RF measurement system 100 may further include an RF signal generator (not shown) for generating an RF spectrum that may be input as a stimulus signal to a device under test (DUT) (not shown). In this case, the input RF spectrum provided to the RF input of the mixer 114 may be an output signal of the DUT responsive to the stimulus signal.

As discussed below, the mixer 114 mixes the input RF spectrum with multiple different LO frequencies within an RF span to be measured. In an embodiment, there are four LO frequencies spaced apart by LO steps or LO offsets, although different numbers of LO frequencies may be incorporated without departing from the scope of the present teachings. Further, the embodiment depicted in FIG. 1 includes a single mixer 114 and a single LO 112, which may be configured to generate each of the different LO frequencies. However, in alternative embodiments, the receiver 110 may include multiple LOs and/or multiple mixers corresponding to the multiple LO frequencies. The IF signals corresponding to the different LO frequencies have IF bandwidths (IFBWs) determined by the sampling rate of the ADC 116. That is, in general, the IF bandwidth is less than one half of the ADC sample rate. The IF signals form ADC data records, respectively, corresponding to the IF bandwidth of the particular IF.

The set of different LO frequencies generated by the LO 112 is chosen to cover the RF span of the input RF spectrum received by the mixer 114, and to provide overlapping IF bandwidths. The LO steps separating the LO frequencies may be uniform or non-uniform. When the LO steps are non-uniform, it means that the LO offsets between adjacent LO frequencies are different from one another. The non-uniform LO offsets may be predetermined by design, or they may determined randomly (i.e., random LO offsets), as discussed below.

The RF measurement system 100 further includes processing unit 120, memory 130, display unit 140 and input/output interface (I/O) unit 150. The processing unit 120 is configured to control overall operations of the RF measurement system 100 and to process data received from the receiver 110. The processing unit 120 may be included in the RF measurement system 100 or may be a separate device, such as a personal computer (PC). The processing unit 120 is connected to the other components of the RF measurement system 100, such as the receiver 110 for controlling various aspects of the receive operation, including determining LO frequencies and offset, and for processing received data, including performing FTs, such as fast Fourier transforms (FFTs), on the digital data records received from the ADC 116 and binning the FTs according to multiple LO acquisitions at each LO frequency, for example. The processing unit 120 is also connected to the memory 130 for storing FT bins and other measurement information, the display unit 140 for displaying frequency spectrums to measure the input RF spectrum, and the I/O unit 150 for enabling interface control by a user. It is understood that any type of wired and/or wireless connections between the processing unit 120 and other components of the RF measurement system 100, enabling transmission of communication and data and control signals, may be incorporated without departing from the scope of the present teachings.

Generally, the processing unit 120 may be implemented by a computer processor (e.g., of a PC or dedicated workstation), application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include memory (e.g., volatile and/or nonvolatile memory) for storing executable software/firmware executable code that allows it to perform the various functions. In an embodiment, the computer processor may comprise a central processing unit (CPU), for example, executing an operating system. The processing unit 120 may include a storage device, such as random access memory (RAM), read-only memory (ROM), flash memory, electrically programmable ROM (EPROM), electrically erasable programmable ROM (EEPROM), hard disk drive (HDD), or the like. Data (e.g., FT and/or FFT bins) from various measurements may be stored in the memory 130 and/or displayed for analysis on the display unit 140, as mentioned above. The memory 130 may include any type of RAM or ROM compatible with the processing unit 120, such as flash memory, EPROM, EEPROM, HDD, or the like. The I/O unit 150 may include any user interface, such as a graphical user interface (GUI), for a user to control operations and/or view data and computation results of the RF measurement system 100.

Figure 2A:
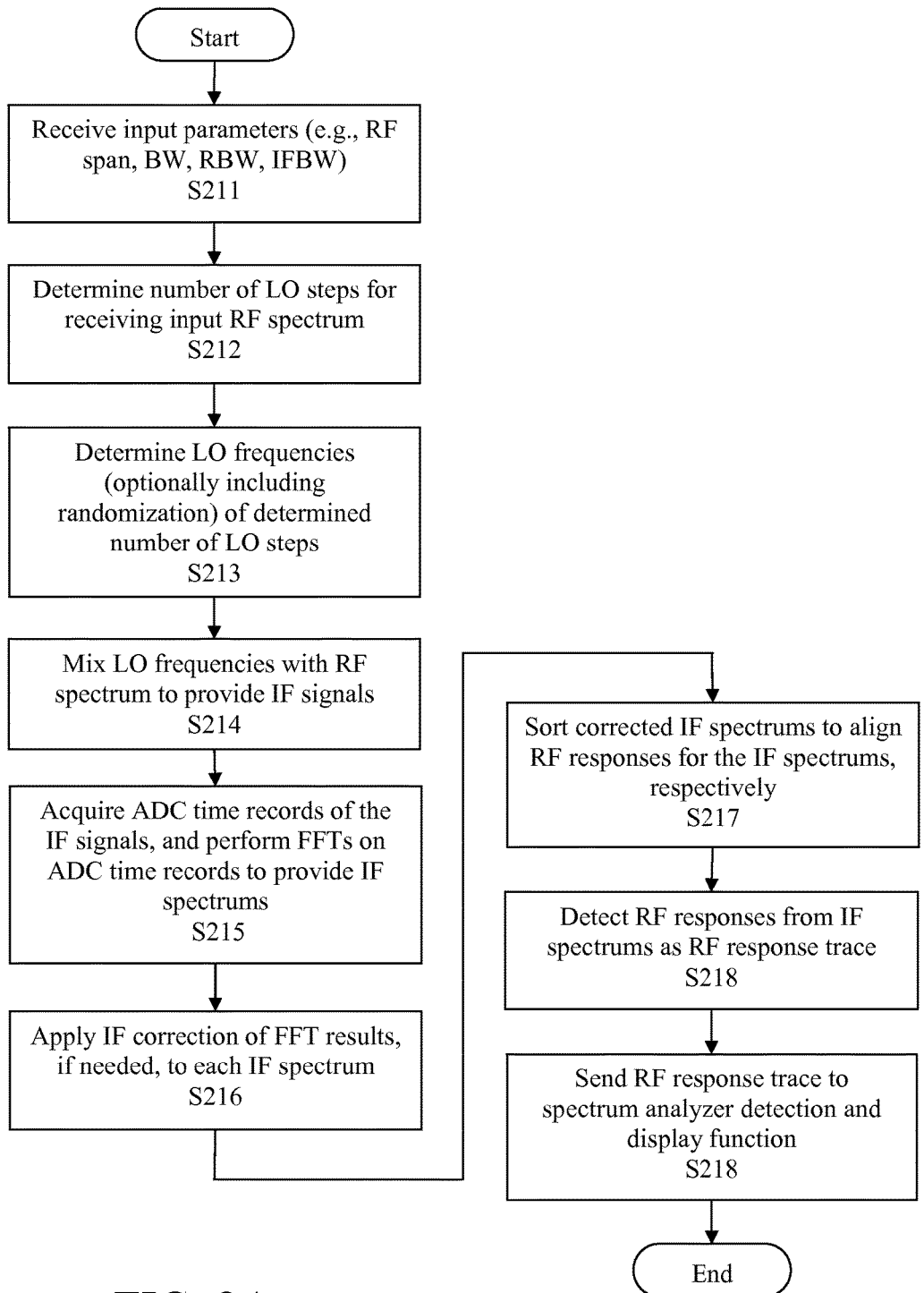
FIG. 2A is a flow diagram of a method of performing image rejection on an input RF spectrum, according to a representative embodiment.

FIG. 2A is a flow diagram of a method of operating a spectrum analyzer as a stepped local oscillator (LO) Fourier transform (FT) analyzer, such as a fast Fourier transform (FFT) analyzer. For purposes of discussion, FFTs will be referenced, although it is understood that other FTs may be incorporated without departing from the scope of the present teaching. The method of FIG. 2A may be performed by the RF measurement system 100 of FIG. 1, for example, although various types of spectrum analyzers and spectrum measuring devices may be incorporated without departing from the scope of the present teachings.

Referring to FIG. 2A, in block S211, initial input parameters are received for operating the spectrum analyzer, and ultimately for detecting an RF response to an input RF spectrum, which may have multiple tones. The input parameters may be input manually by a user, e.g., via the I/O unit 150, or calculated and input automatically by a processing device, e.g., processing unit 120. The input parameters may include, for example, the start and stop frequencies (or RF span) of the input RF spectrum, the bandwidth and the resolution bandwidth RBW of the spectrum analyzer measurement, and an intermediate frequency (IF) bandwidth. The IF bandwidth may be based on the ADC filter width.

The number of LO steps used to cover the RF span is determined in block S212, and the LO frequencies corresponding to the LO steps are determined in block S213, for receiving the input RF spectrum and eliminating image signals. The number of IFs in the RF span is also determined, as the number of IFs is a function of the number of LO frequencies, and the LO frequencies are mixed with the input RF spectrum to provide IF signals, respectively, in block S214.

In various embodiments, the coverage of the LO frequencies overlap one another, such that there are at least three LOs and corresponding IF acquisitions (and IF bandwidths) used per tone of the input RF spectrum. That is, the number of IF acquisitions used per RF frequency is called the overlap. Stated differently, the various embodiments include at least three overlapping LO frequencies resulting in overlapping IF bandwidths. The multiple LO frequencies are used cover the same RF frequencies to generate multiple IF acquisitions. Generally, there is one LO acquisition per LO frequency, although that one LO acquisition may represent multiple RF frequencies. For example the LO acquisition is used as one or more (e.g., typically two) of the IF bandwidth overlaps for RF frequencies below the LO frequency, and the same data is used as the one or more IF bandwidth overlaps for RF frequencies above the LO frequency. Each LO acquisition provides a corresponding ADC time record, discussed below, that represents RF responses both above and below the LO frequency. Each IF signal is the RF response modified by an IF frequency response. In an embodiment, each ADC time record is used N times, for each of N overlaps.

Referring to blocks S212 to S214, the multiple LO frequencies provide a multitude of IF signals which are processed to produce corresponding response trace spectrums, discussed below. In an embodiment, each IF signal covers the same IF bandwidth (maximum-to-minimum frequency range), but represents different RF response ranges depending upon the corresponding LO frequency. IF detection has maximum and minimum frequencies. The RF response range represented by the IF bandwidth is either from the LO frequency minus the IF bandwidth or from the LO frequency plus the IF bandwidth. For example, if the minimum frequency of the IF bandwidth is 1 MHz and the maximum frequency of the IF bandwidth is 34 MHz, and the LO frequency is set at 3 GHz, then the RF response range present in this particular IF corresponds to frequencies from 2.966 GHz to 2.999 GHz and from 3.001 GHz to 3.034 GHz. At the IF, it cannot be discerned in any single LO acquisition whether the IF signal represents an RF signal from above or from below the LO frequency.

In addition, the LO offsets between the LO frequencies of adjacent LO steps, respectively, may not be uniform. In various embodiments, the non-uniform offsets may be predetermined or may be randomly determined, without departing from the scope of the present teachings. LO frequencies separated by random LO offsets may be referred to as random LOs. For example, randomization may be applied to three or more LO frequencies (e.g., four LO frequencies), with each LO frequency spaced randomly from the next. Notably, randomization of just two LO frequencies reduces the chance of an image signal landing on a two-tone signal of an input RF spectrum, but effectively guarantees that, over several sweeps, an image signal will appear for a multi-tone signal having more than two tones. The reason for this is that randomization of the LO frequencies produces a fixed LO step for each LO acquisition, which changes randomly from one LO frequency to another. However, numerous LO frequencies per RF frequency, such as four LO frequencies, for example, are needed to cover a wide RF span of frequencies. When the input RF spectrum is a wideband multi-tone signal, there may be a large comb of equally spaced tones, the spacing of which is unknown to the spectrum analyzer. Accordingly, repeated (e.g., at least three) random LO settings effectively ensures that at some RF frequencies of the tones, the LO offset will land, within the resolution of the IF, on some pair of tones of the input RF spectrum, causing image signals to appear in both LO acquisitions (meaning that the image signals cannot be removed with just two LO acquisitions). In other words, with two random LO frequencies, there is a relatively high likelihood of an LO frequency landing on the spacing between tones. However, with more than two LO frequencies, which are randomly spaced, the LO frequencies cannot land on tone spacings that are evenly spaced. Therefore, at least three frequencies per RF frequency are needed. For wider RF spans, the number of required LO frequencies increases (e.g., as 1/N of the IFBW).

Multiple LO frequencies (e.g., four, six, eight, etc.) that are produced and randomized result in corresponding randomized IF signals. Image signal detecting between the randomized IF signals is measured as a function of each of the multiple LO frequencies. At a minimum, at lest three LO frequencies are needed to ensure that a two-tone input RF spectrum is not detected as an image signal, when the LO frequencies are randomized and the spacing or offset between the LO frequencies are not within an RBW of one another. With an unknown multi-tone input RF spectrum, the chance of recording an image signal at any RF frequency for a multi-tone input RF spectrum of some arbitrary period is approximately $(N*RBW/IF\ BW)^N$, where RBW is the resolution bandwidth and IF BW is the IF bandwidth of the spectrum analyzer measurement, and N is the number of random, overlapping LO frequencies. Thus, for example, if only two LO frequencies are used on a multi-tone signal, as in some conventional systems, with an RBW of 1 MHz, and a IFBW of 40 MHz, the chance of seeing an image signal is approximately $(2*1/40)^2$ or one in 400. In comparison, according to an embodiment using four LO frequencies, the chance of seeing an image signal drops to $(4*1/40)^4$ or one in 10,000. Further, with eight local oscillators (the limit for the maximum number of LO frequencies is on the order of IFBW/RBW), the chance of seeing an image signal is $(8*1/40)^8$ or one in 400,000.

In various embodiments, the randomization of the LO frequencies may not be completely random. Rather, the limits of randomization may be controlled on a sweep-by-sweep basis for optimization of results. For example, the IF signal of the spectrum analyzer is not flat, and typically the IF signal rolls off as the IF frequency increases. In order for image rejection to work well, the LO frequencies should be relatively widely spaced apart from one anther. However, in order for randomization to remove image signals, the randomization should be greater than the RBW of the spectrum analyzer measurement. Therefore, each LO frequency of a sweep may be randomized across two times the maximum RBW, but on a sweep-by-sweep basis, the LO frequency may be randomized across 1/N of the IF BW, so that across several sweeps, any RF frequency uses several different ranges of the IF signal and thus effectively ensures an average noise floor is maintained over several sweeps.

Referring again to FIG. 2A, in block S215, ADC time records of the IF signals are acquired and stored, e.g., by the processing unit 120 and the memory 130, respectively. The ADC time records may include a series of LO acquisitions for each of the LO frequencies, the number of which has been determined according to block S213 above. Fourier transforms, such as Fast Fourier transforms (FFTs) are performed on the ADC time records, e.g., by the processing unit 120, where the FFTs provide corresponding IF spectrums of the ADC time records corresponding to the LO frequencies. In other words, each of the IFs has a corresponding IF spectrum comprising a set of frequency domain ADC time records based on the number of LO acquisitions. Generally, the longer the duration of the ADC time record (and thus the greater number of points), the better the resolution. That is, more FFT bins are available from the same IF BW. For example, for a 40 MHz IF BW, a 2,000 point ADC time record provides 1,000 complex FFT bins, each of which is 40 kHz, while a 2,000,000 point ADC time record provides 1,000,000 complex FFT bins, each of which is 40 Hz. The number of LO acquisitions may be approximated as follows: [RF span/(2*IFBW/number of overlaps)]+N. So, for example, a 1,000 MHz RF span, a 50 MHz IFBW and N=4 will have 44 LO acquisitions. Twice the IFBW is included because each LO frequency has upper and lower IFs, and N/2 is added for each of the end points, so N is added to the number of LO acquisitions.

Thus, each IF spectrum is divided into a number of discrete response frequencies as a result of the FFTs. The FFT has an FFT resolution, and produces a response in the form of an FFT bin. Each FFT bin represents the power of the RF signal in the frequency span of that particular FFT bin. For example, if the IF bandwidth of an IF is 33 MHz wide, and there are 2000 ADC samples, the spectrum analyzer (e.g., the processing unit 120) will create 1000 FFT bins (complex), and each FFT bin will contain a range of frequencies that represent a span of 33 khz (that is, 33 MHz/1000=33 kHz span). Each FFT bin also contains information from two RF frequencies at the same time, above and below the corresponding LO frequency. For example, an FFT bin at 10 MHz contains data from both 10 MHz above the LO frequency and 10 MHz below the LO frequency. So, if the LO frequency is 1000 MHz, the 10 MHz FFT bin represents both 990 MHz and 1010 MHz. All of the FFT bins of the IF spectrum likewise map to two sets of RF frequencies. When the LO frequency is then stepped by 15 MHz, for example, from 1000 MHz to 1015 MHz, the resulting IF spectrum will have a different set of data, where the FFT bin at 5 MHz has the same RF signal as the one that is at 1010 MHz, as well as an RF signal from 1020 MHz. The new data at 10 MHz now represents 1005 MHz and 1025 MHz. This FFT binning process continues for each of the LO frequencies. Therefore, each IF spectrum is comprised of a number of FFT bins, where each FFT bin represents one RF frequency above and one RF frequency below the corresponding LO frequency.

In block S216, IF correction is applied to each of the IF spectrums. More particularly, the IF correction modifies an IF signal to remove error due to IF frequency response, where the IF spectrums have substantially the same amplitudes for the same input level. In other words, in an embodiment, the IF correction provides an IF spectrum so that the RF signal amplitude is correctly represented regardless of the FFT bin within which it falls, thus correcting for IF frequency response differences. In an embodiment, block S216 is optional. That is, IF correction is performed only as needed.

The (corrected) IF spectrums corresponding to the LO frequencies are then sorted in block S217. According to various embodiments, the FFT bins corresponding to the IF spectrums are sorted into collections of RF response bins. Sorting the IF spectrums includes determining for each RF response bin frequency which FFT bins for each of the LO acquisitions correspond to the RF response bins. In general, each FFT bin in each IF spectrum corresponds to two RF response bins.

The RF response bins from the IF spectrums corresponding to the LO frequencies are detected (and saved) as RF response traces in block S218. There will be one RF response trace for each overlap (where there are N overlaps, as discussed above). A final RF response trace is determined (and saved) from the N RF response traces, at each RF response bin. The overall RF response may be determined from the image rejection process applied to the collection of sorted RF response image traces from the RF response bins. In other words, the final RF response trace is effectively a collection of the RF response bins. In an embodiment, detecting the RF responses generally may include determining when some number of equivalent FFT bin values for each IF spectrum are within a threshold of each other, choosing a minimum FFT bin value when none of the FFT bin values is within the threshold, and choosing a mathematical combination of the FFT bin values when the FFT bin values are within the threshold. The chosen minimum FFT bin value or mathematical combination of the FFT bin values may be stored and/or displayed as the RF response for that FFT bin. In block S219, the RF response trace is sent to the detection and display function of the spectrum analyzer, e.g., for display on the display unit 140 and/or storage in the memory 130.

Referring to block S218, a conventional technique to determine the correct RF response of two IF spectrums is to take the minimum of the two IF spectrums. When there are only two spectrums, this is essentially the only processing that can be done. However, according to various embodiments herein, the multiple LO frequencies and corresponding IF signals provide for multiple IF spectrums, which provide an opportunity to do more and different kinds of image rejection based on the IF spectrums. Notably, the IF detection process (e.g., executed by the processing unit 120) has no a-priori knowledge of the input signal, so the displayed results can only be inferred from the multitude of IF spectrums measured as a function of the multitude of the LO acquisitions. The detection process determines the value to put in the final RF response trace from the collection of N RF response traces. After the sorting, the IF spectrums now become RF detection traces which contain both signals to keep and images to reject.

Also, an image signal may vary in amplitude as compared to the real RF signal. For example, the amplitude (or value) of the image signal may be much larger than, similar to, or much smaller than that of the real RF signal. Further, an image signal may appear to land on the same frequency as the real signal, in which case the corresponding IF spectrums will contain the vector sum of the image signal and the real signal. The amplitude and phase of the image signal will determine how it adds to (or subtracts from) the real signal to provide the vector sum. When the amplitudes of the image signal and the real signal are substantially the same, they can add exactly (zero relative phase), providing a 6 dB higher signal, or subtract exactly (180 degrees relative phase), providing no signal (canceling out one another). Generally speaking, an image signal landing on a real signal can cause the amplitude of the detected real signal to vary either larger or smaller.

There can be a multitude of different relationships between image and real signals, all of which may be detected by the embodiments provided herein. Two examples of different scenarios are provided for purposes of illustration. In the first scenario, an image signal is much larger or smaller in amplitude than the RF signal present (e.g., greater than about 3 dB larger). In the second scenario, an image signal lands on the RF signal. Assuming an embodiment in which four LO acquisitions (using corresponding four LO frequencies) provide IF spectrums that cover each RF frequency, when the image signal is much larger than the real signal, there will be one large signal and three smaller signals of approximately the same value. The three smaller signals will be noise (assuming the image signal does not land on the RF signal). When the image signal lands on an RF signal, and adds destructively, there is one small signal and three signals that are of approximately the same value (all larger in amplitude than the small signal).

When the image signal is much larger than the real signal, as in the first scenario, and the conventional technique works well, the minimum value from among the four signals is chosen as the real signal, and the correct response may be displayed. However, when the image signal lands on the RF signal, as in the second scenario, the conventional technique fails and the wrong value of the real signal would be displayed. Notably, in a multi-tone situation, both scenarios may occur, and the resulting IF can show two signals, approximately the same amplitude, with a third signal being larger (due to an image signal adding to the real RF signal)

and one signal being smaller (due to a different image signal subtracting from the real RF signal). The technique according to various embodiments is defined so that it determines whether the amplitude values of the four (or more) IF spectrums corresponding to the four (or more) LO frequencies are within a predetermined threshold, such as 1 dB, for example. If so, the average of the four signals is taken as the real signal. If not, the signals having the maximum and minimum amplitude values are discarded. It is then determined whether the amplitude values of the remaining two signals are within another (broader) predetermined threshold. If they are, then the average of the remaining two signals is taken as the real signal, and if not, then the signal having the minimum amplitude value is taken as the real signal. This technique provides the ability to reliably remove unwanted image signals, while being simple to implement using very fast comparisons.

Figure 2B:
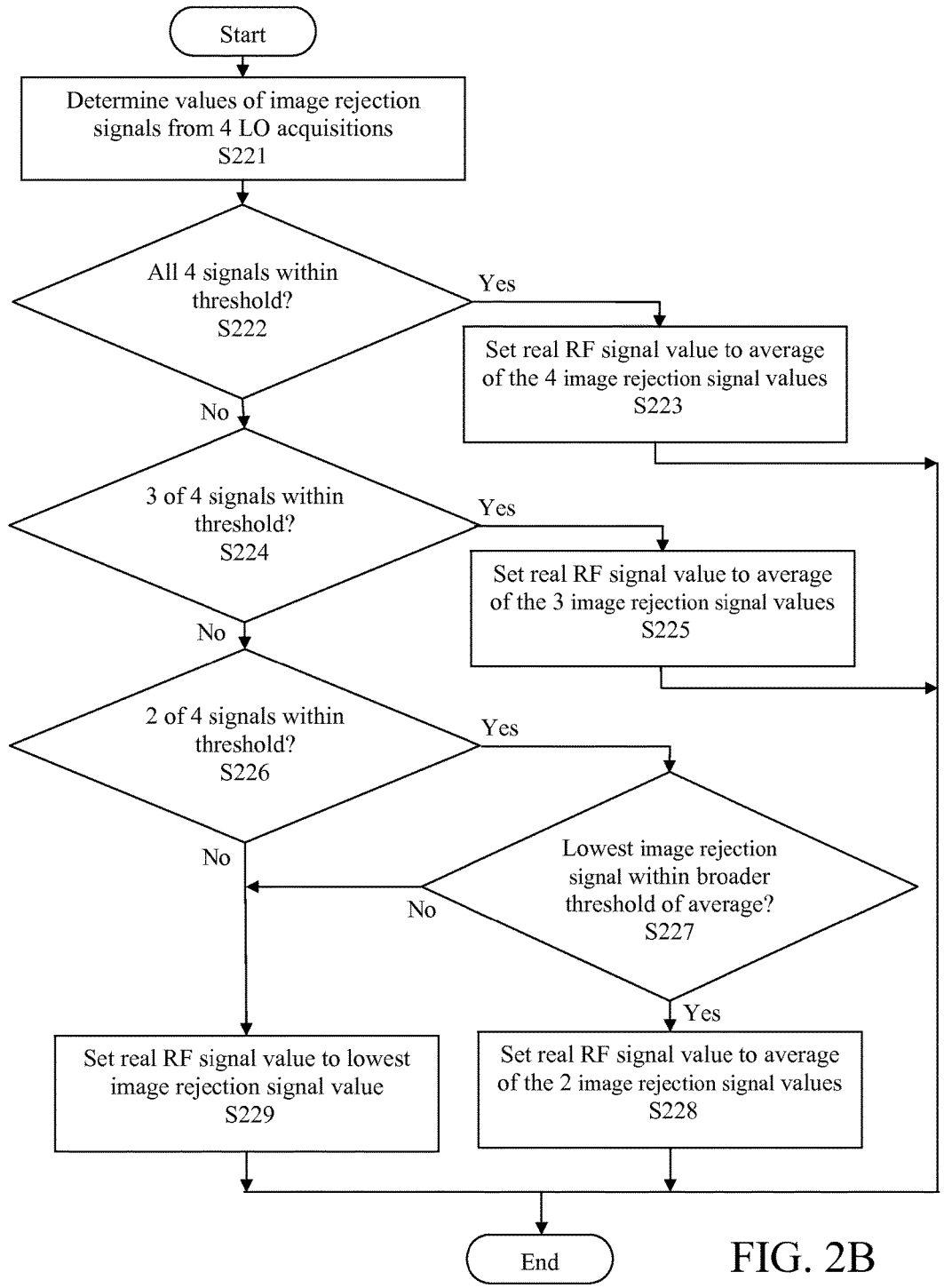
FIG. 2B is a flow diagram of a method of detecting RF responses from IF spectrums of an input RF spectrum, according to a representative embodiment.

FIG. 2B is a flow diagram of a method of detecting RF responses from IF spectrums of an input RF spectrum, according to representative embodiments. As in the above discussion, it is assumed that the process shown in FIG. 2B uses four LO frequencies and corresponding LO acquisitions to provide IF spectrums covering each RF frequency. FIG. 2B combines multiple sub-processes that may be executed in a particular order depending on the values and/or relative values of image rejection signals corresponding to the LO acquisitions, discussed further below with reference to FIGS. 9 and 10.

Referring to FIG. 2B, the values (amplitudes) of the four image rejection signals for the RF response at a particular RF frequency are determined in block S221. In block S222, it is determined whether all four image rejection signals are within a predetermined narrow threshold (e.g., 0.1 dB). The narrow threshold may be determined based on the IFBW correction error, for example. When all four image rejection signals are within the narrow threshold (block S222: Yes), the real signal is set to the average of the four image rejection signals in block S223, and the process ends. When all four image rejection signals are not within the narrow threshold (block S222: No), the process proceeds to block S224.

In block S224, it is determined whether three of the four image rejection signals from the LO acquisitions are within the predetermined narrow threshold (e.g., 0.1 dB). When any three of the four image rejection signals are within the narrow threshold (block S224: Yes), the real signal is set to the average of the three image rejection signal values in block S225, and the process ends. When there is no combination of three of the four image rejection signals that are within the narrow threshold (block S224: No), the process proceeds to block S226.

In block S226, it is determined whether two of the four image rejection signals are within the predetermined narrow threshold (e.g., 0.1 dB). When any two of the four image rejection signals are within the narrow threshold (block S226: Yes), the process proceeds to block S227, where it is determined whether the image rejection signals (from among the four image rejection signals) having the lowest value is within a predetermined broader threshold (e.g., about 3 dB to about 6 dB) of both of the two image rejection signals within the narrow threshold of one another. Alternatively, it may be determined whether the lowest value is within one of the two image rejection signals or within the average of the two image rejection signals, without departing from the scope of the present teachings. When the lowest image rejection signal is within the broader threshold of the two image rejection signals (block S227: Yes), the real signal is set to the average of the two image rejection signal values in block S228, and the process ends. When the lowest image rejection signal is not within the broader threshold of the two image rejection signals (block S227: No), and the image rejection signal with the highest value is higher than the broader threshold (although the highest image rejection signal could be compared to a yet another predetermined threshold different from the broader threshold, without departing from the scope of the present teachings), and the lowest image rejection signal is lower than the broader threshold, the real signal is set to the lowest of the four image rejection signal values in block S229, and the process ends. Alternatively, if the lowest image rejection signal is at the noise floor of the system, the real signal is set to the lowest image rejection signals (i.e., the noise floor). This alternative requires previous knowledge of the noise floor. Referring back to block S226, when no two of the four image rejection signals is within the narrow threshold (block S226: No), the real signal is set to the lowest of the four image rejection signal values in block S229, and the process ends.

More complex forms of image rejection are possible as more overlapping LO frequencies and corresponding IF signals are added. In various embodiments, any number of overlapping LO frequencies (e.g., from 2 to 9) may be used. The technique is dynamic depending upon the number of LO frequencies. For two LO frequencies, for example, when the values of the resulting two image reject signals are within a narrow predetermined threshold, similar to the above discussion, the average value of the two image reject signals is taken as the real signal. Otherwise, when the values of the two image reject signals are not within the narrow threshold, the image reject signal having the minimum value may be taken as the real signal. Because the IF signal is not perfectly flat even with subsequent IF correction, taking the average of two (or more) image reject signals generally improves the accuracy of the detection.

As the number of overlapping LO frequencies increases, the complexity of the image rejection likewise increases. A variety of choices can be made for how the multitude of images can be processed beyond the simple minimum. For example, first determine if an image reject signal is a real signal or an image signal. To do this, look at the image reject signals and determine if most (for example three-fourths) of the image reject signals have the same value within a narrow threshold. If so, the average of the image reject signals with the narrow threshold may be determined as the real signal. Alternatively, discard the highest N/3 image reject signals, where N is the total number of LO frequencies, and discard the lowest N/3 image reject signals, and take the average of the remaining image reject signals as the real signal.

In the case of a very dense signal environment, multiple signals may appear as image signals. It is therefore likely that there will be one very large image signal, several smaller image signals, and one real signal or no real signal represented by the noise floor. The probability that a pair of image signals will exactly cancel to the noise floor is very low. So, when the a noise floor is detected for one of the LO frequencies, and a very large difference is detected between the image reject signal having the highest amplitude value and the image reject signal having the next highest amplitude value, the image reject signal having the lower value will be chosen as the real signal. This case can be determined either by a pre-knowledge of the receiver's noise floor, or set by checking deviations of the maximum and minimum image reject signals, and if they are sufficiently large, the presumption can be made that the middle image reject signals are caused by crossing images (as discussed below with reference to FIG. 10). This is reasonable recognizing the fact that there it is unlikely to have a condition in which a real signal appears at two LO frequencies, is completely extinguished in a third, and is very large in a forth. In fact, when the broader threshold is excessively large (e.g., greater than 6 dB), then the condition of an equal image signal landing with the proper phase on a real signal is recognized.

Figure 3:
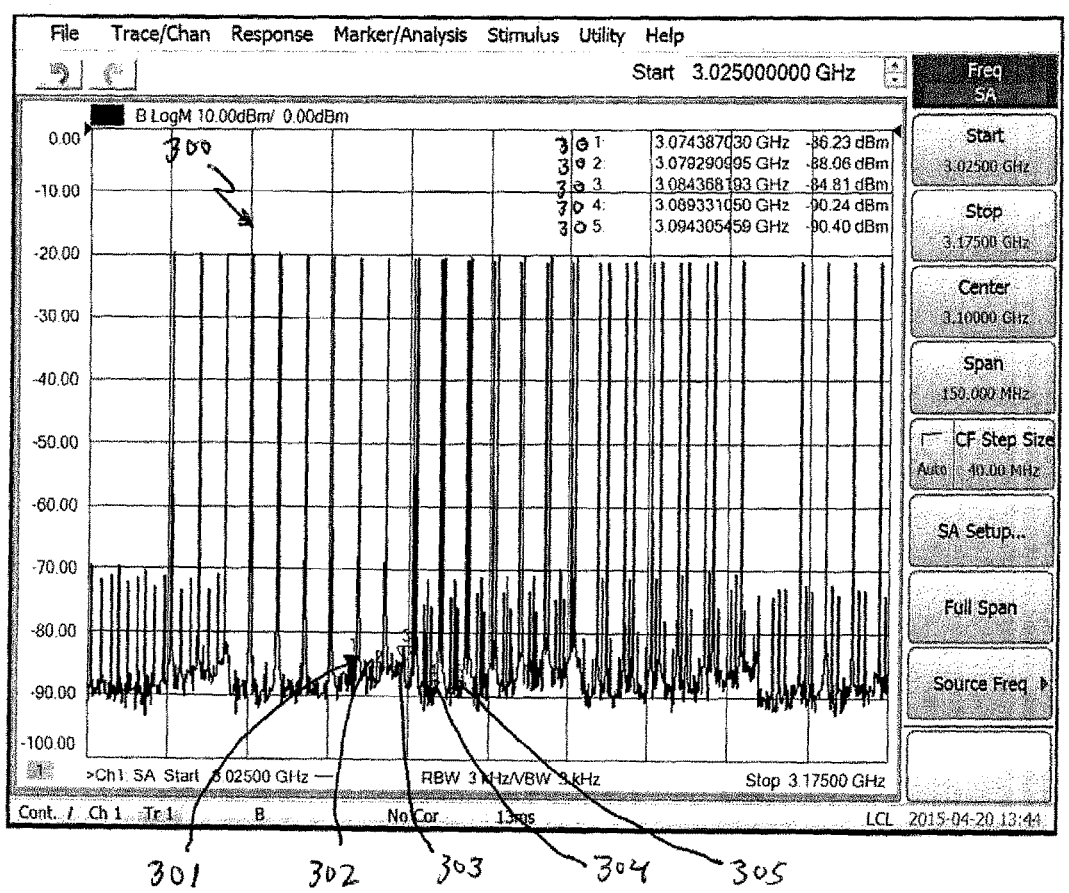
FIG. 3 is an illustrative display of frequency response for a multi-tone RF spectrum detection with no image rejection process.

FIG. 3 is an illustrative display of frequency response for a multi-tone RF spectrum detection with no image rejection process, and FIGS. 4 through 10 are illustrative displays of frequency responses for multi-tone RF spectrum detection and image rejection processes, according to representative embodiments. In each of the illustrative displays, the y-axis indicates signal amplitude in dB (e.g., from 0 dB to −100 dB), and the x-axis frequency (e.g., 3.025 GHz to 3.175 GHz). The center frequency of the RF span is 3.1 GHz.

Figure 4:
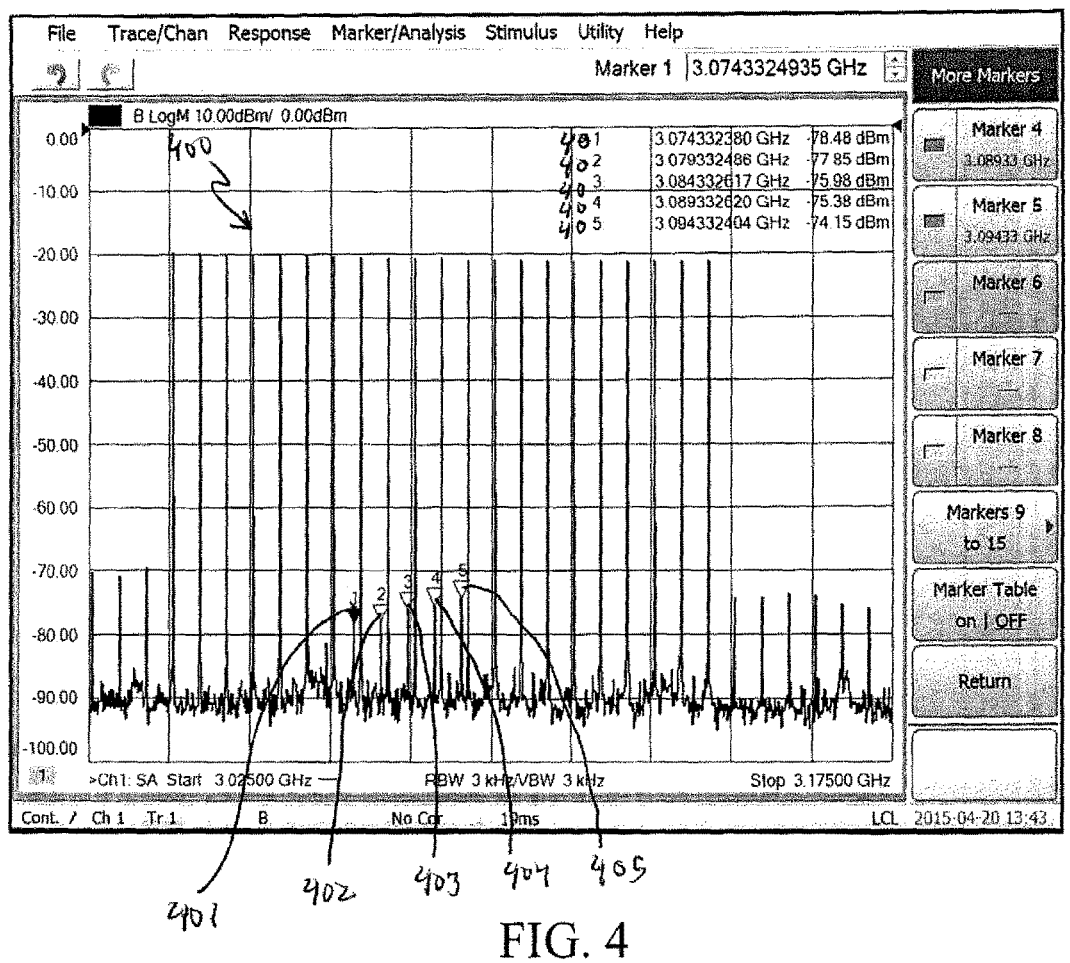
FIG. 4 is an illustrative display of frequency responses for a multi-tone RF spectrum detection and no image rejection process.

FIG. 3 shows trace 300 resulting from using multiple LO acquisitions to obtain IF spectrums, with no image rejection. The input signal is an input RF spectrum having multiple tones spaced evenly, e.g., at 1 MHz spacings. The undesired image signals appear not evenly spaced between the real input signals. That is, all the smaller tones, indicated by markers 301-305, located between the larger tones are undesired image signals. Notably, very large image signals are also seen in the last graticule of the display FIG. 4 shows trace 400 resulting from using two LO frequency overlaps, as discussed above, with no image rejection process. For example, a first LO frequency may be positioned at 3.000 GHz and a second LO frequency may be positioned at 3.033 GHz, where 33 MHz is the LO offset frequency (or LO step). The IF signals corresponding to the RF ranges covered by the second LO frequency therefore would be from 2.999 GHz to 3.032 GHz. This second LO frequency would also produce IF signals in the RF range of 3.034 GHz to 3.067 GHz. Thus, there is a continuous response covered if the LO offset is a maximum of the IF maximum frequency minus the IF minimum frequency. In the present example the continuous response would be from 2.999 GHz to 3.067 GHz. Notably, the undesired image signals are a consequence of the input RF spectrum having a tone spacing that nearly matches the LO offsets.

As shown in FIG. 4, the LO frequency overlaps generally provide good results, and the number of image signals are significantly reduced. However, if the tone spacing from the unknown input RF spectrum happens to land exactly on the LO offset, then image signals will appear as indicated by markers 401-406 on the trace 400. In general, for a fixed LO offset, there will exist a multi-tone spectrum that can cause image signals.

Multi-tone spectrums with fixed tone spacings are known in RF and microwave technology, since fixed tone spacings are produced by Arbitrary-Waveform-Generators (arbs) to play back a time domain pattern which might represent cellular band signal content. The tone spacing will be the inverse of the time-record length. Thus, it is desirable to have an image rejection process that is able to reject image signals from multi-tone signals.

Figure 5:
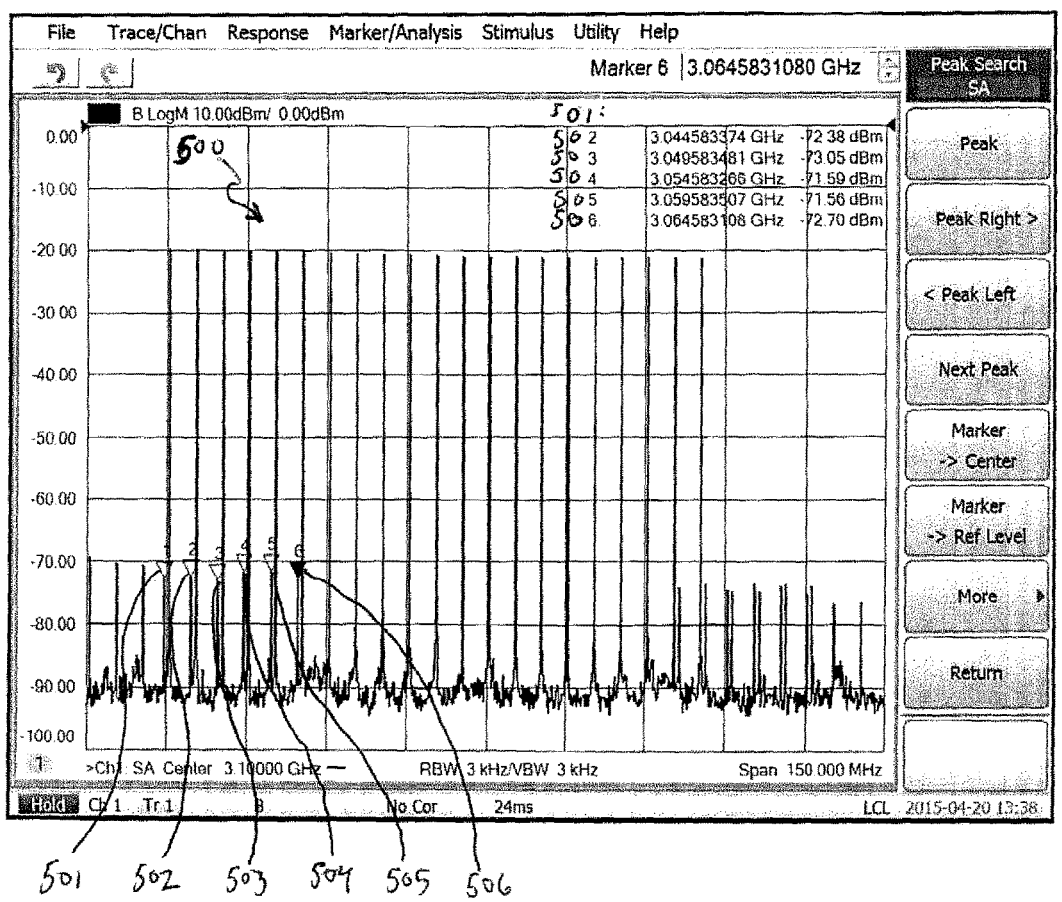
FIG. 5 is an illustrative display of frequency responses for a two-tone RF spectrum detection and image rejection process, with random LO offsets, according to a representative embodiment.

FIG. 5 shows trace 500 resulting from using two random LO frequencies, randomly offset from one another. One way to obtain better image rejection is to set the LO frequency randomly between IF acquisitions, so that the tone spacing of the input RF spectrum will not fall in the same relative position. This works well but with the LO offsets, and only two LO overlaps, there still exists the likelihood that one of the random LO offsets will land on an unknown tone spacing of the input RF spectrum. (In general, it is not known beforehand what the tone spacing is of the input RF spectrum). The image signals of FIG. 5 are in one region of the band, indicated by markers 501-506.

Figure 6:
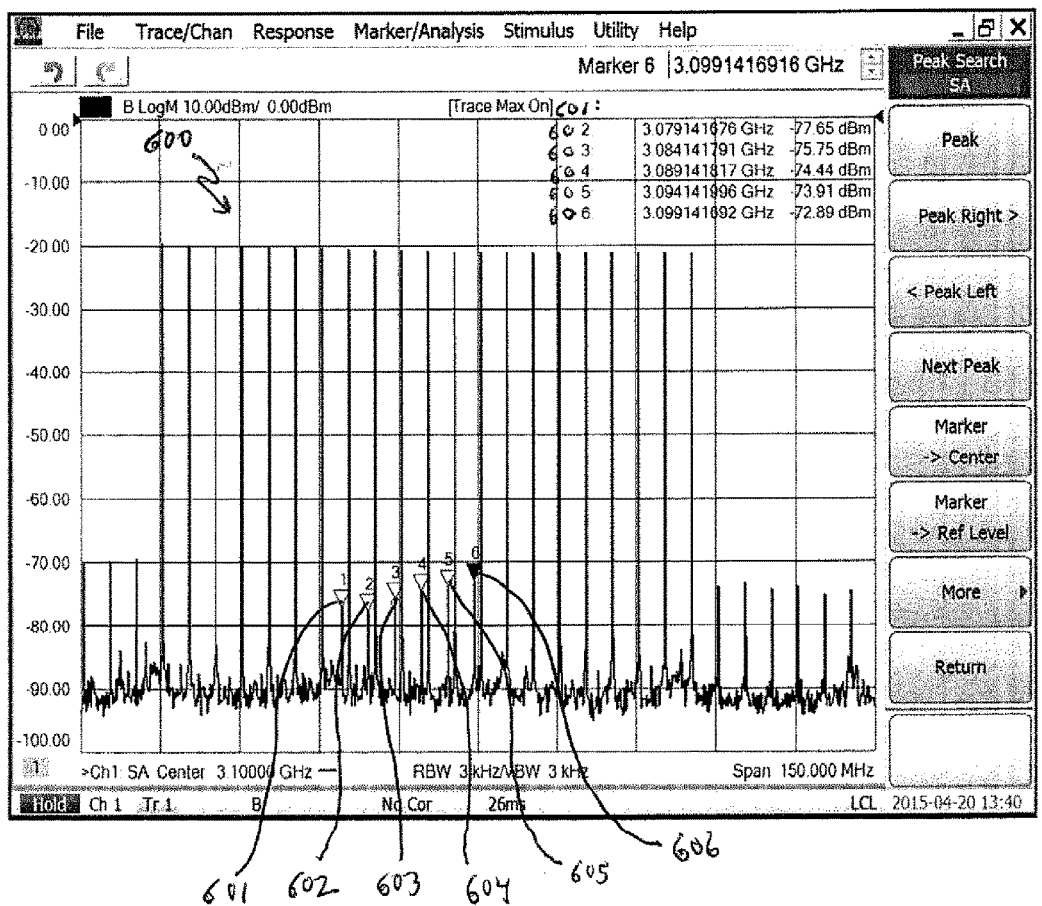
FIG. 6 is an illustrative display of frequency responses for a two-tone RF spectrum detection and image rejection process, with random LO offsets, according to a representative embodiment.

FIG. 6 shows trace 600 resulting from using two random LO frequencies, randomly offset from one another, after several more sweeps, where a different random LO offset allows images to appear in a different region of the band, indicated by markers 601-606. Since the LO frequency is random, and the RF span is greater than the IFBW, several sets of LO frequencies are needed to get the full RF span. In FIG. 5 (discussed above), the set of LO frequencies randomly landed in an undesirable region at the beginning of the sweep. In FIG. 6, the set of LO frequencies randomly landed in a more desirable region near the middle of the sweep. The span of considered for generally quality of the region may be one IF span (e.g., about 30 MHz. With just two LO overlaps, it cannot be guaranteed that image signals of a multi-tone input RF signals will be isolated by processing the IF spectrum. The possibility still exists that a random LO offset will land exactly on the tone spacing and cause a large image signal. However, as discussed below, taking four LO overlaps guarantees that there will be no image signals from an input RF spectrum that has only two tones.

Figure 7:
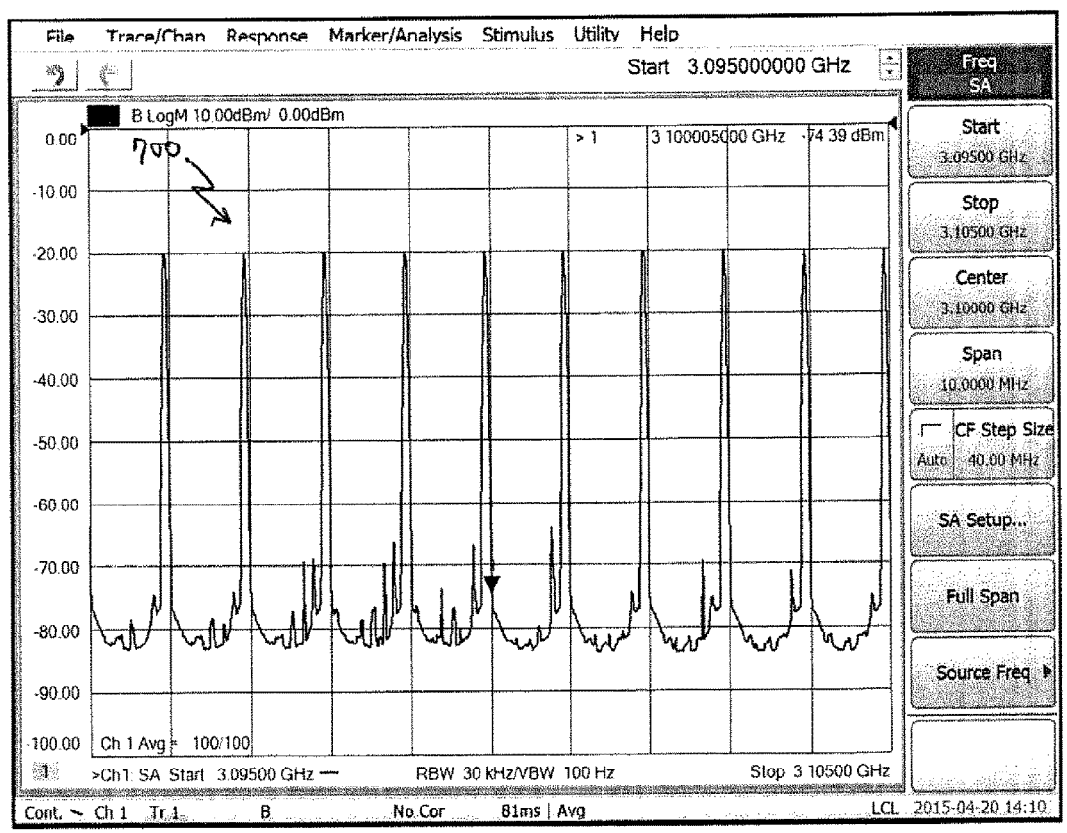
FIG. 7 is an illustrative display of frequency responses for a multi-tone RF spectrum detection and image rejection process, with fixed LO offsets, according to a representative embodiment.

FIG. 7 shows trace 700 resulting from using four LO overlaps for image rejection, where the LO offset between LO frequencies is a fixed value (which is a narrower RF span to illustrate the images better). The tone spacing is on the same order as the LO offset. In this implementation, the four LO images are generated in a way that forces the LO offset to be a fixed value. It works well for two-tone input RF spectrums, but does not work well for multi-tone input RF spectrums having more than two tones, which are prevalent in modern communication systems. In depicted case, sweep-to-sweep averaging is used to reduce noise since the RBW of the spectrum analyzer measurement is rather wide, making it difficult to see the image signals. The image signals are just discernible between the main tones at levels of about −67 dBm to about −80 dBm. This is a case where the multi-tone spacing is near the LO offset spacing, thus showing relative poor image signal rejection with fixed or uniformly spaced LO offsets.

More particularly, in the depicted example, four LO frequencies are used. A first LO frequency at 3.079 GHz covers about 3.080 GHz to about 3.113 GHz; a second LO frequency at 3.093 GHz covers about 3.094 GHz to about 3.128 GHz; a third LO frequency at 3.110 GHz covers about 3.077 GHz to about 3.109 GHz (which is below the third LO frequency) and about 3.111 GHz to about 3.143 GHz (which is above the third LO frequency); and a fourth LO frequency at 3.125 GHz covers about 3.092 GHz to about 3.124 GHz (which is below the fourth LO frequency) and about 3.126 GHz to about 3.158 GHz (which is above the fourth LO frequency). This gives four LO acquisitions in the range of about 3.092 GHz to about 3.109 GHz, thus covering the RF span of 3.095 GHz to 3.105 GHz. Each new LO frequency gives 16 MHz more RF points until the end of the band is reached, in the case the RF span extended farther in frequency than 3.109 GHz. In general, each IF spectrum is not continuous because quite near the LO frequency there is usually a DC block that excludes values near DC. In an embodiment, 1 MHz to 34 MHz may be used for the operation (i.e., a 33 MHz IFBW), which really covers 68 MHz of the RF spectrum with a 2 MHz hole in the middle.

According to various embodiments, image signal recognition is improved for a two-tone input RF spectrum using four overlaps. There is further improvement with regard to multi-tone input RF spectrums if the LO offsets between the adjacent LO frequencies are randomized across each LO offset.

Figure 8:
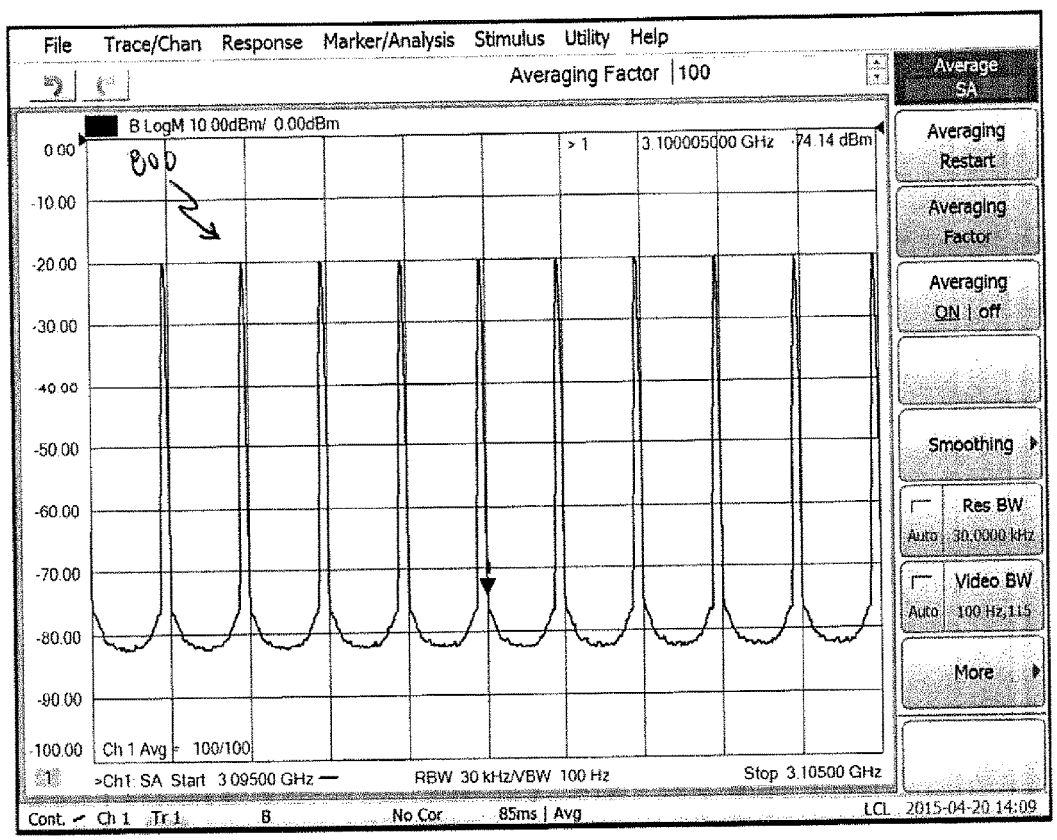
FIG. 8 is an illustrative display of frequency responses for a multi-tone RF spectrum detection and image rejection process, with random LO offsets, according to a representative embodiment.

FIG. 8 shows trace 800 resulting from measuring the same input RF spectrum as shown in FIG. 7, except with LO offset having random values as opposed to fixed values. Unlike the multi-tone signal trace shown in FIG. 7, there are no cases of image signals apparent in the response trace shown in FIG. 8 since, because of the random LO offset, a fixed-spaced tone of the input RF spectrum cannot create an image signal that appears the same in the IF spectrums if the LO offset is randomized between each IF acquisition, and there are more than two IF signals used to detect an image signal. FIG. 8 shows the result of such a 4-LO overlap, with random LO offset. Thus, randomized LO offsets with more than two overlaps eliminate image signals from multi-tone input RF spectrums. Notably, non-uniform LO offsets with more than two overlaps, even if not necessarily randomized, likewise eliminate image signals from multi-tone input RF spectrums.

For the common case of two overlaps of IF signals, the image reject technique is very simple: just take the signal having the smaller value of the two signals in each image trace. However, in some cases, taking the signal with the smaller value may produce an error because an image signal may land on top of a real signal, making the real signal appear to be larger (most common) or smaller than the desired signal. Thus, always choosing the smaller signal can lead to amplitude error.

Figure 9:
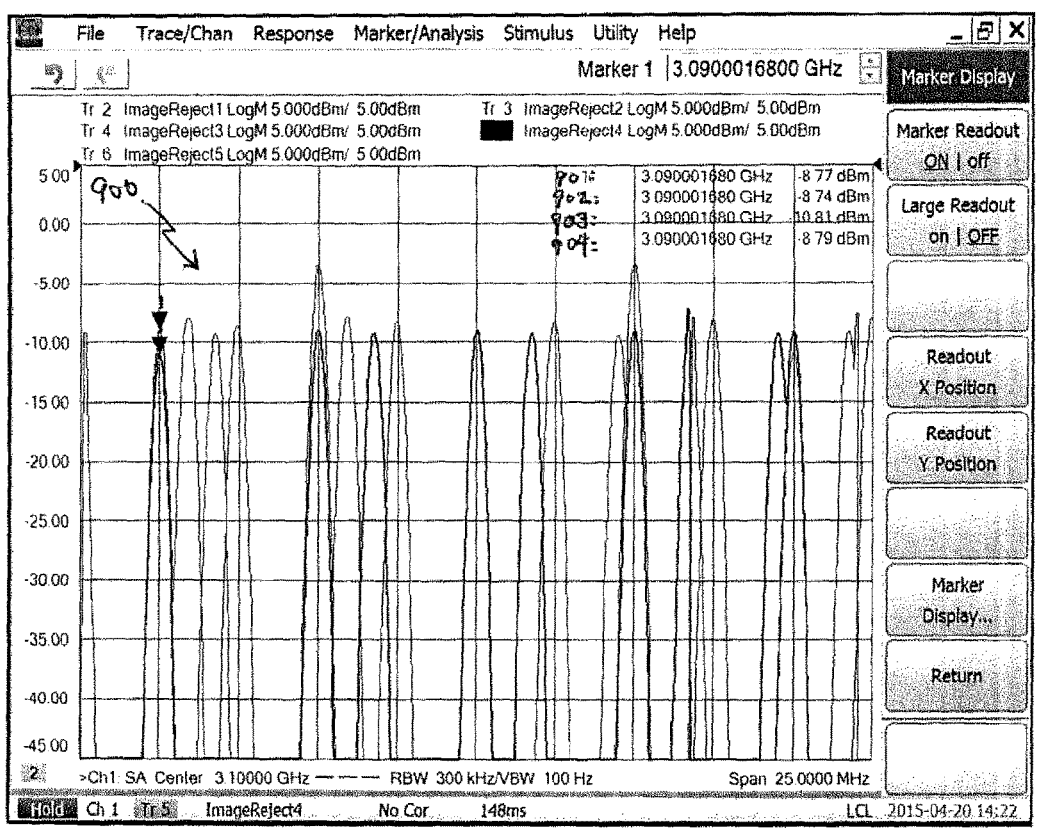
FIG. 9 is an illustrative display of image reject traces for determining a frequency response trace, according to a representative embodiment.

FIG. 9 shows image reject traces 900 which will be processed to compute the spectrum analyzer response trace, for a particular image situation. The image reject traces 900 are input to the detection process from which image signal and/or real signal determinations are made. Markers 901-904 show the values that would be used for the detection process, so each of the markers 901-904 represents one FFT bin, as discussed above. Referring to the image reject traces 900 at the first graticule, the various image reject signals show one image reject signal (indicated by marker 903) smaller than the others (indicated by markers 901, 902 and 904, respectively). However, choosing the minimum image reject signal at a real signal in this case is likely incorrect because three of the four image reject signals have the same value, and one of the image reject signals is different, likely because an image signal landed on a real signal and subtracted (or added destructively), due to phasing. More particularly, in the depicted example, the minimum image reject signal is −10.81 dBm (marker 903), while the other three image reject signals are −8.77, −8.74 and −8.79 dBm, respectively (markers 901, 902 and 904). It is therefore apparent that an unwanted image signal has landed on a real signal, making the combined image reject signal conspicuously smaller.

Figure 10:
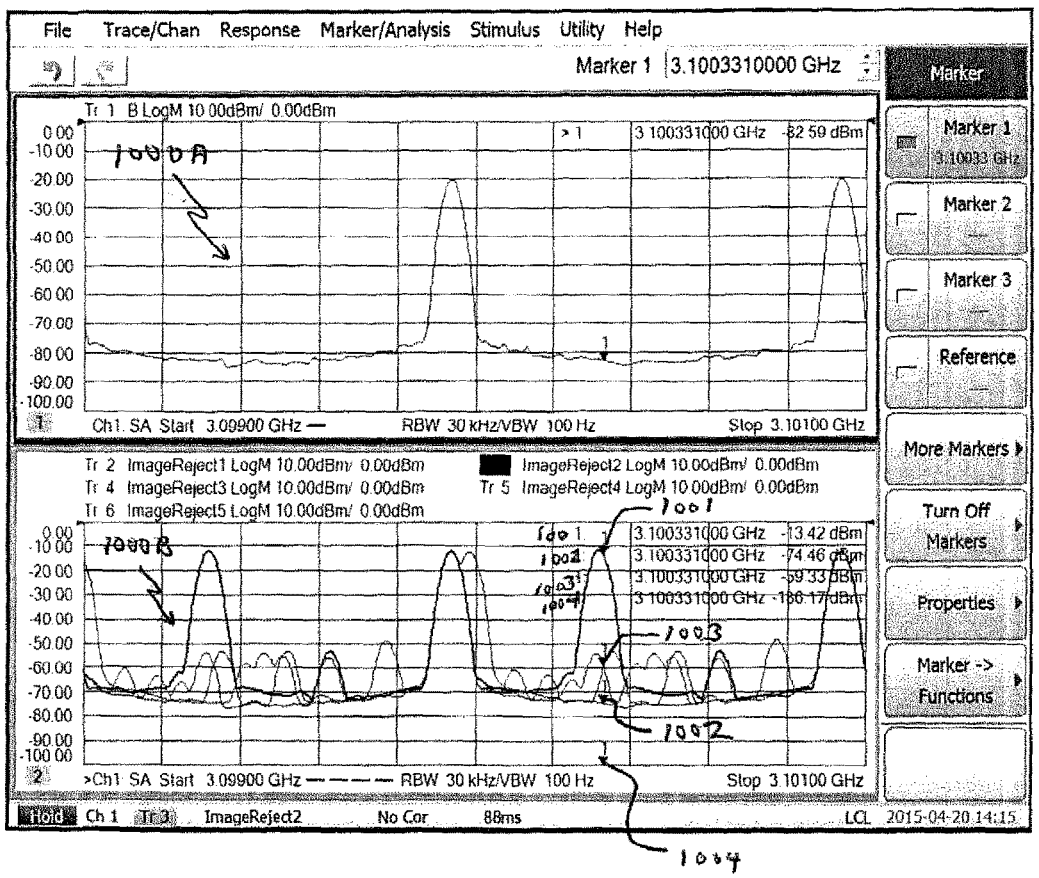
FIG. 10 is an illustrative display of a frequency response trace for a multi-tone RF spectrum detection and image rejection process, and a corresponding illustrative display of image reject traces for determining the frequency response trace, according to a representative embodiment.

FIG. 10 shows trace 1000A (top) resulting from using four LO overlaps for image rejection, and image reject traces 1000B (bottom) where there are both large and small image reject signals in the same region, indicated by markers 1001-1004. In the depicted example, the simple technique of throwing out the image signals having the largest and smallest values, and averaging the values of the remaining two image signals (which are within a predetermined threshold of one another), e.g., as discussed above with reference to FIG. 2B, fails.

For example, in the scenario depicted in FIG. 10, inclusion of the large image reject signal indicated by marker 1001 would cause the average to be calculated incorrectly. A more sophisticated technique is to determine the spread of signals, from the image reject signal having the maximum value (e.g., indicated by marker 1001) to the image reject signal having the minimum value (e.g., indicated by marker 1004). If the spread of the signals is greater than some predetermined threshold, then the minimum image reject signal is selected as the real signal. If the spread of the image reject signals is less than the predetermined threshold, then the image reject signals are averaged to determine the real signal. As the number of LO overlaps increases, more signals are available to choose from, so the spread of the image reject signals may be redefined to be either more aggressive in removing signals or more aggressive in detecting signals. More aggressive in detecting signals generally means choosing the average value with a larger threshold, or lower percentage. For example, with six image reject signals (from six LO acquisitions), more aggressive signal detection would include choosing the average of four of the six image reject signals (that is, using a two thirds percentage rather than three fourths) of the same value, or even choosing the average of three of the six image reject signals of the same value, within the threshold. More aggressive in removing images means maybe requiring five of the six image reject signals to be the same value, within the threshold.

For example, referring to FIG. 10, marker 1001 shows where there is one large image rejection signal, markers 1002 and 1003 show two smaller image rejection signals that cross, and marker 1004 shows an image rejection signal in the noise. The two image rejection signals that cross, indicated by markers 1002 and 1003, give the impression that they have the same value, and thus would pass a simple determination that the two image rejection signals having the same value are not image signals, and can be averaged to determine the value of the real signal. However, using a measure of the threshold from the two image rejection signals to the lowest image rejection signal, indicated by marker 1004, it can seen that the crossing image rejection signals are not real signals, but rather image signals, and should be rejected. This is because the minimum image reject signal is chosen when the minimum image reject signal is below the broader threshold of the other two image reject signals, as discussed above. The trace 1000A in the upper display of FIG. 10 shows the spectrum analyzer response with the image signals rejected.

One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed is:

1. A method of operating a radio frequency (RF) measurement system acting as a spectrum analyzer for eliminating image signals from a detected input RF spectrum, the method comprising:
determining at least three local oscillator (LO) frequencies required for receiving the input RF spectrum;
determining LO offsets between the at least three LO frequencies, wherein the determined LO offsets are non-uniform;
mixing the at least three LO frequencies with the input RF spectrum to provide at least three corresponding intermediate frequency (IF) signals having an IF bandwidth, wherein at least one of the IF signals has the input RF spectrum mixed to a different portion of the IF bandwidth than at least one other of the IF signals, thereby providing overlapping coverage of the input RF spectrum;

acquiring ADC time records for the IF signals;

performing Fourier transforms (FTs) on the ADC time records to provide IF spectrums, each IF spectrum comprising a plurality of FT bins representing a corresponding plurality of RF frequency bins representing the input RF spectrum; and detecting RF responses from the IF spectrums to determine an RF response trace corresponding to the input RF spectrum.

2. The method of claim 1, wherein the non-uniform LO offsets are random.

3. The method of claim 1, wherein detecting the RF responses comprises:

determining when a number of equivalent FT bin values for each IF spectrum are within a threshold of each other;

choosing a minimum FT bin value when none of the FT bin values is within the threshold; and choosing a mathematical combination of the FT bin values when the FT bin values are within the threshold.

4. The method of claim 3, further comprising:

displaying the chosen minimum FT bin value or mathematical combination of the FT bin values as the RF response for that FT bin.

5. A method of operating a spectrum analyzer as a stepped local oscillator (LO) fast Fourier transform (FFT) analyzer, the method comprising:

determining a radio frequency (RF) span, an intermediate frequency (IF) bandwidth, and a resolution bandwidth (RBW) of the spectrum analyzer;

determining a number of LO steps required in the RF span for receiving a plurality of input RF spectrums, and for eliminating images based on the RF span, the IF bandwidth, and the RBW, wherein the RF span is greater than each of the plurality of input RF spectrums;

determining overlapping LO frequencies corresponding to the LO steps, respectively, wherein a number of overlapping LO frequencies is greater than two and wherein LO offsets of the LO frequencies of adjacent LO steps are not uniform;

acquiring ADC time records for the LO frequencies, respectively;

performing fast Fourier transforms (FFTs) on the ADC time records corresponding to the LO frequencies to provide IF spectrums;

sorting the IF spectrums to align RF responses of the IF spectrums, respectively; and detecting the RF responses from the IF spectrums to determine an RF response trace corresponding to the input RF spectrums.

6. The method of claim 5, wherein LO offsets of the LO frequencies of adjacent LO steps are random.

7. The method of claim 5, wherein detecting the RF responses from the IF spectrums comprises:

determining when some number of equivalent FFT bin values for each IF spectrum are within a threshold of each other;

choosing a minimum FFT bin value when none of the FFT bin values is within the threshold;

choosing a mathematical combination of the FFT bin values when the FFT bin values are within the threshold; and displaying the chosen minimum FFT bin value or mathematical combination of the FFT bin values as the RF response for that FFT bin.

8. The method of claim 5, wherein detecting the RF responses from the IF spectrums comprises:

determining values of image rejection signals corresponding to the overlapping LO frequencies;

determining whether all image rejection signals are within a predetermined narrow threshold; and setting a real RF signal value to an average of all the image rejection signals when all of the image rejection signals are within the predetermined narrow threshold.

9. The method of claim 5, wherein detecting the RF responses from the IF spectrums comprises:

determining values of a plurality of image rejection signals corresponding to the overlapping LO frequencies;

determining whether a predetermined number of image rejection signals of the plurality of image rejection signals have values within a predetermined narrow threshold, the predetermined number of image rejection signals being greater than two; and setting a real RF signal value to an average of the values of the predetermined number of the image rejection signals when the predetermined number of the image rejection signals have values within the predetermined narrow threshold.

10. The method of claim 5, wherein detecting the RF responses from the IF spectrums comprises:

determining values of a plurality of image rejection signals corresponding to the overlapping LO frequencies;

determining whether values of two of the image rejection signals are within a predetermined narrow threshold;

determining whether a value of at least one other of the image rejection signals is within a predetermined broader threshold; and setting a real RF signal value to an average of the two image rejection signals when the values of the two image rejection signals are within the predetermined narrow threshold, and the value of the at least one other of the image rejection signals is within the predetermined broader threshold.

11. The method of claim 5, further comprising:

applying IF correction to each ADC time record.

12. The method of claim 5, further comprising:

sending the RF response trace to detection and display functions of the spectrum analyzer for displaying the RF response trace.

13. A radio frequency (RF) measurement system acting as a spectrum analyzer, comprising:

a receiver configured to receive an input radio frequency (RF) spectrum having a predetermined RF span, wherein the receiver comprises:

at least one local oscillator (LO) configured to generate at least three LO signals having different LO frequencies, respectively;

a mixer configured to mix each of the at least three LO signals with the input RF spectrum to provide at least three intermediate frequency (IF) signals with corresponding IF bandwidths, wherein at least one of the IF signals has the input RF spectrum mixed to a different portion of the corresponding IF bandwidth than at least one other of the IF signals, thereby providing overlapping coverage of the input RF spectrum; and an analog to digital converter (ADC) configured to convert the at least three IF signals to digital IF signals; and a processing unit configured to perform Fourier transforms (FTs) on the digital IF signals to provide corresponding IF spectrums comprising FT bins representing a corresponding plurality of RF frequency bins representing the input RF spectrum, and to analyze each of the FT bins to detect RF responses from the FT bins corresponding to the LO frequencies and to reject any image signal resulting from at least one RF signal of the RF spectrum overlapping with one of the LO frequencies, wherein each FT bin represents one RF frequency above and one RF frequency below the corresponding LO frequency.

14. The RF measurement system of claim 13, further comprising:
a display configured to display a response trace corresponding to the detected RF responses.

15. The RF measurement system of claim 13, wherein LO offsets between adjacent LO frequencies of the at least three LO signals are randomly spaced.

16. The RF measurement system of claim 13, wherein LO offsets between adjacent LO frequencies of the at least three LO signals are not uniformly spaced.

17. The RF measurement system of claim 13, wherein the processing unit being configured to detect RF responses from the FT bins comprises:
determining when equivalent FT bin values for each IF spectrum are within a threshold of each other;
choosing a minimum FT bin value when none of the FT bin values is within the threshold; and
choosing a mathematical combination of the FT bin values when the FT bin values are within the threshold, the chosen minimum FT bin value or the mathematical combination of the FT bin value being the RF response for that FT bin.

* * * * *